United States Patent [19]
Kahlen et al.

[11] Patent Number: 4,849,806
[45] Date of Patent: Jul. 18, 1989

[54] SHUNTING ELEMENT

[75] Inventors: Hans Kahlen, Weinheim; Bernd Jahnke, Neckargemünd; Conrad Schmidt, Gaiberg; Botho Ziegenbein, Neckarsteinbach, all of Fed. Rep. of Germany

[73] Assignee: Brown, Boveri & Cie AG, Mannheim, Fed. Rep. of Germany

[21] Appl. No.: 154,499

[22] Filed: Feb. 4, 1988

Related U.S. Application Data

[63] Continuation of Ser. No. 756,397, Jul. 17, 1985, abandoned.

[30] Foreign Application Priority Data

Jul. 17, 1984 [DE] Fed. Rep. of Germany ....... 3426199

[51] Int. Cl.⁴ ............................................. H01L 29/34
[52] U.S. Cl. ...................................... 357/51; 357/40; 357/45; 357/71
[58] Field of Search ......................... 357/40, 45, 51, 71

[56] References Cited

U.S. PATENT DOCUMENTS 4,358,784 11/1982 Wislocky et al. .................... 357/71
4,403,399 9/1983 Taylor .................................. 357/40
4,480,261 10/1984 Hattori et al. ....................... 357/71

Primary Examiner—Edward J. Wojciechowicz
Attorney, Agent, or Firm—Herbert L. Lerner; Laurence A. Greenberg

[57] ABSTRACT

A shunting element includes two terminal elements for bridging an electrical component, at least one semiconductor component, and at least one electrically conducting layer connecting the semiconductor component to the two terminal elements, the electrically conducting layer being alloyed with the semiconductor component to form a shorting element upon the passage of a current which increases the temperature in the electrically conducting layer and in the semiconductor component to a given value.

3 Claims, 3 Drawing Sheets

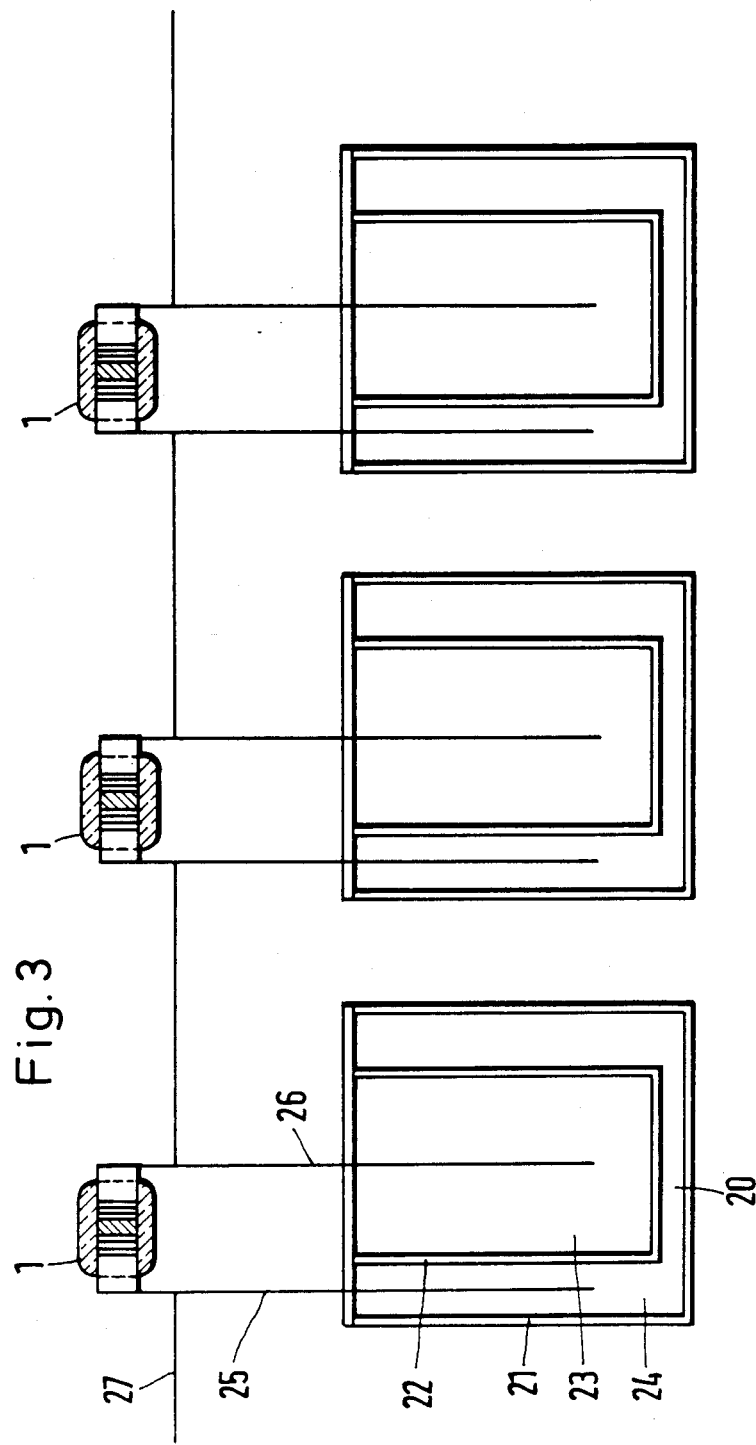

SHUNTING ELEMENT

This application is a continuation of application Ser. No. 756,397, filed July 17, 1985, now abandoned.

The invention relates to a shunting element with two electrical terminals for shunting an electric component, especially a rechargeable electrochemical storage cell.

Such shunting elements are particularly applicable to high-temperature batteries which are constructed of rechargeable electrochemical storage cells. In such a case the shunting elements serve for shunting storage cells. The operation of the storage cells has been disturbed and they must therefore be separated from the circuit of the high-temperature battery so that the capacity of the battery is not substantially decreased. In high-temperature batteries which are used for vehicles, the need exists to connect many electrochemical storage cells in series and only a few in parallel. The reasons for this are that the energy content of such a battery will generally be smaller than 40 kWh, but the energy content of a single storage cell is larger than 80 Wh. This leads to the conclusion that a vehicle battery must not contain more than 500 storage cells. If a total of 200 volts is to be generated with such a battery with a voltage of about 2 volts for each individual storage cell, 100 storage cells must be connected in series. This means that at most 5 storage cells can be connected in parallel. Since the redundancy with 5 parallel-connected storage cells is not very large, it is advisable to connect as many storage cells as possible in series. Such branches can then be connected in parallel. N storage cells are always connected in series to form a branch. M branches with N storage cells each are connected in parallel and form a block.

The entire battery is composed of p such series-connected blocks. According to an example discussed below, the battery contains $N \times M \times p$ storage cells.

With the prior art circuit, problems arise if one storage cell of a series circuit becomes defective In the case of sodium/sulfur storage cells, it has been found that a defect usually occurs if the solid electrolyte develops cracks, so that the reactants which are sodium and sulfur can chemically react with each other directly and voltage is no longer delivered by the storage cell. Such a defective storage cell has a high internal resistance which is usually greater than the ohmic resistance of a storage cell which is intact by a factor of 2. The consequence thereof is that only a very small or no charging or discharging current flows through the branch with the defective storage cell. If the resistance of the defective storage cell is very large, the branch in which the defective storage cell is located fails completely as a power supply. This means that under these conditions, the capacity of the whole battery is smaller than that of an intact battery by a factor $(m-1)/m$.

German Patent No. (DE-PS) 31 17 385 describes a shunting element which is intended for shunting an individual storage cell. The shunting element is substantially formed by two directly adjacent spaces. The first space is filled with a metal or a metal compound which can be decomposed. At the operating temperature of the storage cell, the metal must be liquid and the metal compound must be decomposable at this temperature. The second space of the shunting element contains the contact surfaces of two electrodes which are disposed at a defined distance from each other. A further electrode is contained in the space, into which the metal or the metal compound is filled. If the resistance of the storage cell becomes high, a voltage reversal at its electrodes comes about and therefore, a voltage reversal at the terminals of the shunting element occurs. The metal or the metal compound contained in the first space is therefore transported into the second space. If the second space is completely filled with the metal or metal compound, the two electrodes disposed in this space are connected by the liquid material in an electrically conducting manner, in such a way that the current flowing through the series circuit now flows through the shunting element. It is a disadvantage of this shunting element that its structure is too elaborate and requires a great deal of space, which is just not available in a high-temperature storage battery that is surrounded by thermal insulation.

It is accordingly an object of the invention to provide a shunting element for an electrical component, especially an electrochemical storage cell, which overcomes the hereinafore-mentioned disadvantages of the heretofore-known devices of this general type, which has small dimensions, is of simple construction and in addition can be produced inexpensively.

With the foregoing and other objects in view there is provided, in accordance with the invention, a shunting element, comprising two terminal elements for bridging an electrical component especially a rechargeable electrochemical storage cell, at least one semiconductor component, and at least one electrically conducting layer connecting the semiconductor component to the two terminal elements, the electrically conducting layer being alloyed with the semiconductor component to form a shorting element upon the passage of a current which increases the temperature in the electrically conducting layer and in the semiconductor component to a given value.

According to the invention, such a shunting element is connected in parallel to any electrical component which is to be shunted when necessary. In high-temperature storage batteries which are constructed on the basis of sodium and sulfur, the two terminals of a storage cell are connected to each other through such a shunting element.

The shunting element is constructed in such a way that in the case of an intact storage cell which is connected in series with further storage cells, the current flows through the storage cell itself. If a disturbance occurs within the storage cell, such as a fracture of the solid electrolyte made of beta-aluminum oxide which separates two reactant spaces of the storage cell from each other, the resistance of the storage cell becomes high and the current flow through it is interrupted. The shunting element according to the invention is constructed in such a way that it responds only if the storage cell to which it is connected in parallel, acquires a high resistance. The shunting element takes over the entire current which otherwise flows through the storage cell. This current flow causes a temperature rise within the shunting element. Since the shunting elements are connected in parallel with the storage cell and are furthermore disposed within the high-temperature battery, the ambient temperature of the shunting elements is about 350°, which corresponds to the operating temperature of the individual storage cells.

In accordance with another feature of the invention, the given temperature increased by current for alloying the electrically conducting layer and the semiconductor component into the shorting element is at least 570° C.

A current which flows through the shunting element connected parallel to a storage cell after the resistance of the storage cell has become high, causes a temperature increase within the shunting element to values above 570° and substantially more.

In accordance with an added feature of the invention, the semiconductor component is a silicon diode.

In accordance with an additional feature of the invention, the electrically conducting layer disposed on the cover surfaces of a disc-shaped semiconductor component is formed of aluminum or an aluminum alloy. At a temperature above 570° C. and more, the layers of aluminum and at least the outer layers of the semiconductor component, begin to melt. Together with the diode, the aluminum or aluminum alloy layers form a eutectic mixture which acts as a low-resistance shorting element.

In accordance with a further feature of the invention, there is provided a nickel-chromium-molybdenum layer disposed on the electrically conducting layer, a silver layer disposed on the nickel-chromium-molybdenum layer, and a molybdenum layer disposed on the silver layer and connected to the terminal elements, for improving contacting of the terminal elements.

In accordance with a concomitant feature of the invention, the semiconductor component is disk shaped and has two outer surfaces, the at least one electrically conducting layer being two layers each being disposed on a respective one of the surfaces of the semiconductor component, two nickel-chromium-molybdenum layers each being disposed on a respective one of the electrically conducting layers, two silver layers each being disposed on a respective one of the nickel-chromium-molybdenum layers, and two molybdenum layers each being disposed on a respective one of the silver layers and being connected to a respective one of the terminal elements. The nickel-chromium-molybdenum layer provides better contacting of the respective electrical terminal with the semiconductor component. The silver layer disposed between the nickel-chromium-molybdenum layer and the outer molybdenum layer is used to take up thermal expansion of the molybdenum layer and to provide equalizing action. The semiconductor component as well as the adjoining layers are surrounded by a passivating layer. The entire shunting element can be disposed within a housing for protection.

Other features which are considered as characteristic for the invention are set forth in the appended claims.

Although the invention is illustrated and described herein as embodied in a shunting element, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIG. 3 is a cross-sectional view of three storage cells, wherein a shunting element is connected parallel to each storage cell in a series circuit.

Figure 1:
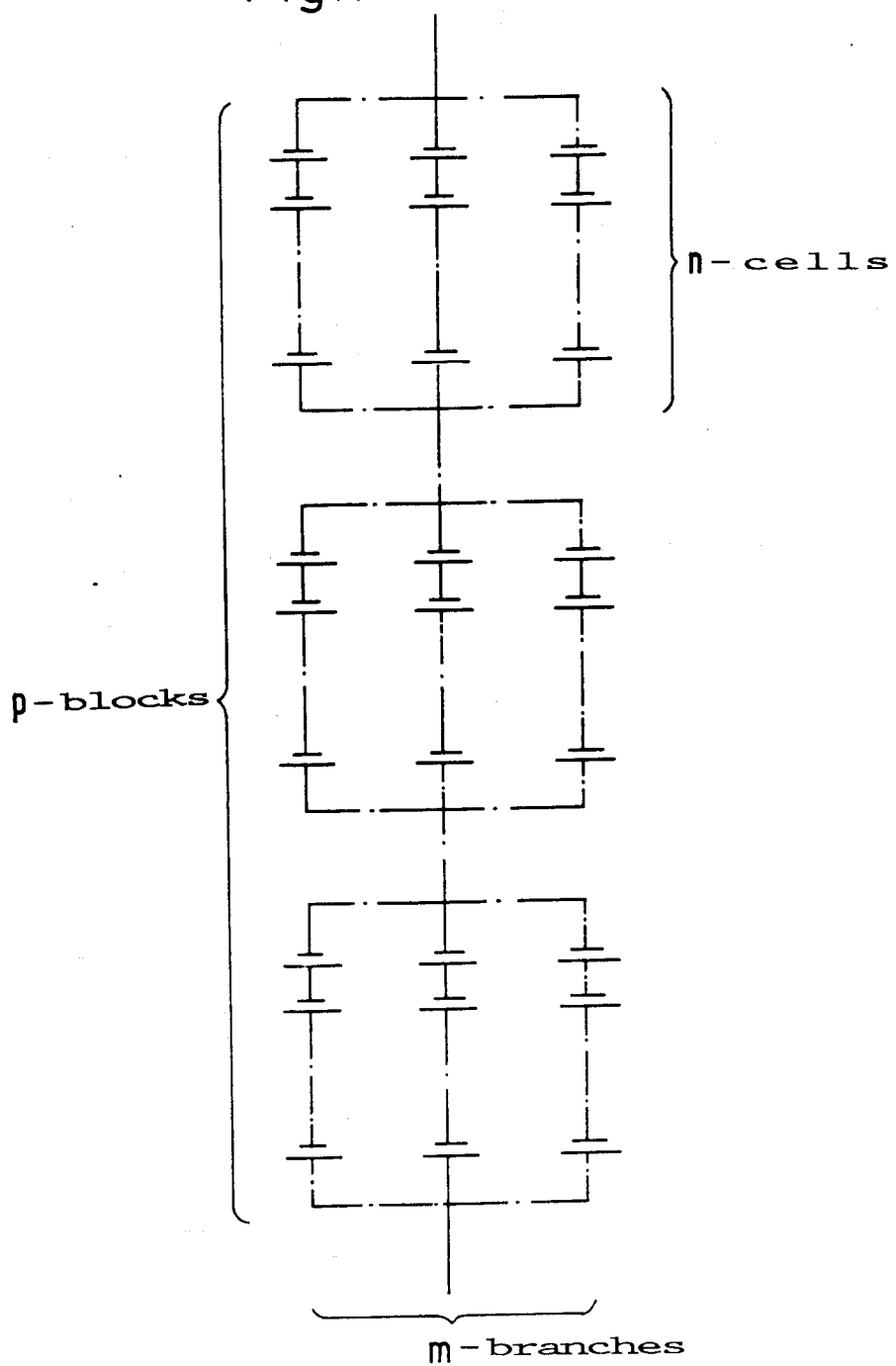
FIG. 1 is a schematic circuit diagram showing the connection of storage cells within a high-temperature storage battery.

Referring now to the figures of the drawings in detail and first, particularly to FIG. 1 thereof, there is seen a circuit of N storage cells which are always connected in series to form a branch. M branches with N storage cells each are connected in parallel to form a block. The entire battery is formed of p-series-connected blocks. According to FIG. 1, the battery contains $N \times M \times p$ storage cells.

Figure 2:
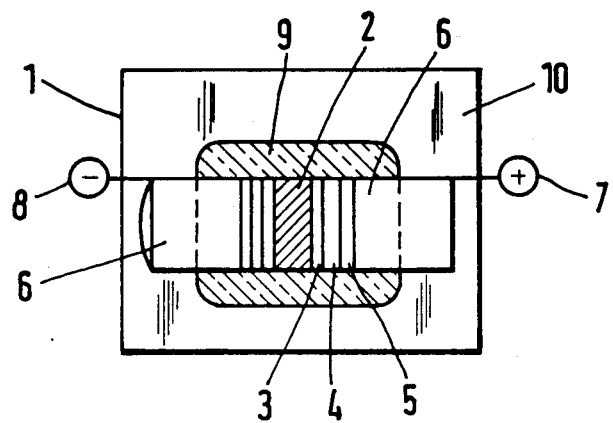
FIG. 2 is a cross-sectional view of a shunting element according to the invention.

A shunting element 1 shown in FIG. 2 is essentially formed of a semiconductor component 2 which is a disc-shaped silicon diode in the illustrated embodiment. An electrically conducting layer 3 of aluminum is applied to each of two respective round cover surfaces of the semiconductor component. Each of these two aluminum layers 3 is followed outwardly by respective nickel-chromium-molybdenum layer 4. A silver layer 5 is placed on the two layers 4 for equalizing the thermal expansions of adjoining molybdenum layers 6 which occur. As is shown in FIG. 2, the shunting element 1 according to the invention is of symmetrical construction, with the imaginary axis of symmetry being formed by the semiconductor component 2. The two outer molybdenum layers 6 are provided for the direct connection of electrical terminal elements 7 and 8. This involves the use of two wires, each of which is soldered into a respective molybdenum layer 6. The nickel-chromium-molybdenum layers 4, each of which is always applied to a respective one of the aluminum layer 3, are provided for a better contacting of the electrical terminals 7 and 8 with the semiconductor component 2. In the illustrated embodiment, the positive terminal is designated with reference numeral 7 and the negative terminal with reference numeral 8. As FIG. 2 also shows, the semiconductor component 2 and the layers 3, 4, 5 and 6 applied thereto are surrounded by a protective glass passivating layer 9. The entire shunting element is inserted into a protective housing 10. Only the free ends of the two electrical terminal elements 7 and 8 protrude from the housing.

FIG. 3 shows a series circuit of three electrochemical storage cells which belong to a non-illustrated high-temperature storage battery. The storage cells 20 are diagrammatically shown in the illustrated embodiment. Each storage cell 20 is bounded toward the outside thereof by a metallic housing 21 within which a cup-shaped solid electrolyte 22 is disposed. The electrolyte is made of a beta-aluminum oxide and separates two reactant spaces 23 and 24 from each other. In the illustrated embodiment, non-illustrated sodium is filled into the solid electrolyte 22 and in particular into the anode space 23, while the cathode space 24 disposed between the metallic housing and the solid electrolyte 22 contains non-illustrated sulfur. A current collector 25, 26 protrudes into each respective reactant space 23, 24. As is shown in FIG. 3, the current collector 26 protruding into the solid electrolyte 22 is connected in an electrically conducting manner with the current collector 25 protruding into the cathode space 24 of the adjacent storage cell 20, by an electric conductor 27. The two current collectors 25 and 26 of each storage cell 20 are connected to each other by a shunting element 1 according to the invention. The storage cells 20 operate at a temperature of 350° C. or at a temperature value somewhat above it. If the storage cells are completely in order, the current flows through the series circuit of the storage cells during charging and discharging, particularly from one storage cell to the next. If a fracture of the solid electrolyte 22 occurs in one or more storage cells of the illustrated series circuit, each storage cell having a defect acquires a high resistance after a very short time, since the two reactants contained in the reactant spaces flow together and can react with each other. Every defective storage cell therefore acquires a high resistance so that the discharging and charging current which normally flows through it from an adjacent cell can no longer flow through it.

In order to bridge the circuit through this defective storage cell and to thereby avoid a failure of the entire series circuit, the storage cells 20 are each provided with a shunting element. The current which flows from an intact storage cell to a defective storage cell is taken up by the shunting element 1. The shunting element connected in parallel with each storage cell 20 is disposed in such a way that during normal operation of each storage cell 20, i.e., if the cell is fully operable, the semiconductor component contained in the shunting element 1 is poled in the reverse direction. Due to the fracture of the solid electrolyte 22, a storage cell acquires a high resistance, and a voltage reversal at the current collectors 25 and 26 occurs. This means that the voltage present at the terminals 7 and 8 of the shunting element is also reversed and the semiconductor component is therefore poled in the forward direction. The current coming from the adjacent storage cells of the series circuit therefore flows through the shunting element, in particular through the semiconductor component 2. The ohmic loss heat which increases greatly with the diode current, heats the shunting element 1 especially in vicinity of the semiconductor component 2, in such a way that temperatures of more than 570° C. and more are reached. The effect of this temperature rise is that the semiconductor component begins to melt, at least in vicinity of its outer surface. The aluminum layers 3 surrounding the semiconductor component 2 also melt. The liquid aluminum causes a lowering of the melting point of the silicon. This brings about the development of a eutectic mixture, so that a shorting element is formed which can permanently bridge the circuit through the defective storage cell. The foregoing is a description corresponding in substance to German Application No. P 34 26 199.0, dated July 17, 1984, the International priority of which is being claimed for the instant application. Any material discrepancies between the foregoing specification and the aforementioned corresponding German application are to be resolved in favor of the latter.

I claim:

1. Shunting element, comprising two terminal elements for bridging connection to an electrical component, one semiconductor component being disk shaped silicon diode having two surfaces each having directly applied thereto an electrically conducting layer made of aluminum alloy, each of said conducting layers being followed outwardly by a nickel-chromium-molybdenum layer; a silver layer, and a molybdenum layer disposed on said silver layer; each of said two molybdenum layers being connected to a respective one of said two terminal elements; said two electrically conducting layers of aluminum alloy being alloyed with said semiconductor component to form a shorting element upon the passage of a current which increases the temperature in said electrically conducting layers and in said semiconductor component to a given value.

2. Shunting element, comprising two terminal elements for bridging connection to an electrical component, one semiconductor component being a disk shaped silicon diode having two surfaces, each having directly applied thereto an electrically conducting layer made of aluminum; each of said conducting layers being followed outwardly by a nickel-chromium-molybdenum layer; a silver layer, and a molybdenum layer disposed on said silver layer; each of said molybdenum layers being connected to a respective one of said two terminal elements; said two electrically conducting layers of aluminum being alloyed with said semiconductor component to form a shorting element upon the passage of a current which increases the temperature in said electrically conducting layers and in said semiconductor component to a given value.

3. Shunting element, comprising two terminal elements for bridging connection to an electrical component, one semiconductor component being a disk shaped silicon diode having two surfaces, each having directly applied thereto an electrically conducting layer made of one of aluminum and aluminum alloy; each of said conducting layers being followed outwardly by a nickel-chromium-molybdenum layer; a silver layer, and a molbdenum layer disposed on said silver layer; each of said two molybdenum being connected to a respective one of said two terminal elements; said two electrically conducting layers of aluminum being alloyed with said semiconductor component to form a shorting element upon the passage of a current which increases the temperature in said electrically conducting layers and in said semiconductor component to 577° C.

* * * * *